US008597757B2

(12) United States Patent
Tauchi et al.

(10) Patent No.: US 8,597,757 B2
(45) Date of Patent: Dec. 3, 2013

(54) RECORDING LAYER FOR OPTICAL INFORMATION RECORDING MEDIUM, OPTICAL INFORMATION RECORDING MEDIUM, AND SPUTTERING TARGET

(75) Inventors: Yuki Tauchi, Kobe (JP); Yoko Shida, Kobe (JP); Takeshi Miki, Tokyo (JP); Yasuhiro Sone, Tokyo (JP)

(73) Assignees: Kobe Steel, Ltd., Kobe-shi (JP); Sony Corporation, Tokyo (JP)

( * ) Notice: Subject to any disclaimer, the term of this patent is extended or adjusted under 35 U.S.C. 154(b) by 0 days.

(21) Appl. No.: 13/496,661

(22) PCT Filed: Sep. 16, 2010

(86) PCT No.: PCT/JP2010/066099
§ 371 (c)(1),
(2), (4) Date: Mar. 16, 2012

(87) PCT Pub. No.: WO2011/034153
PCT Pub. Date: Mar. 24, 2011

(65) Prior Publication Data
US 2012/0176883 A1  Jul. 12, 2012

(30) Foreign Application Priority Data

Sep. 18, 2009  (JP) ................................. 2009-217352
Sep. 18, 2009  (JP) ................................. 2009-217353

(51) Int. Cl.
*G11B 7/24*  (2013.01)

(52) U.S. Cl.
USPC ..................... 428/64.1; 428/64.4; 430/270.12

(58) Field of Classification Search
USPC ....................................... 428/64.4; 430/270.1
See application file for complete search history.

(56) References Cited

U.S. PATENT DOCUMENTS

| 6,033,752 A | 3/2000 | Suzuki et al. |
| 2003/0228539 A1 | 12/2003 | Hosoda et al. |
| 2005/0082162 A1 | 4/2005 | Uno et al. |
| 2005/0233247 A1 | 10/2005 | Hosoda et al. |

(Continued)

FOREIGN PATENT DOCUMENTS

| JP | 63-46635 | 2/1988 |
| JP | 63-175243 | 7/1988 |

(Continued)

OTHER PUBLICATIONS

U.S. Appl. No. 13/496,079, filed Mar. 14, 2012, Tauchi, et al.

(Continued)

*Primary Examiner* — Elizabeth Mulvaney
(74) *Attorney, Agent, or Firm* — Oblon, Spivak, McClelland, Maier & Neustadt, L.L.P.

(57) ABSTRACT

A recording layer for optical information recording medium excellent in recording property, an optical information recording medium including the recording layer and a sputtering target useful for formation of the recording layer are provided. A recording layer for an optical information recording medium on which recording is performed through irradiation with laser light, the recording layer including an oxide of a metal of which an absolute value of the standard free energy of oxide formation per 1 mol of oxygen is larger than that of Pd (hereinafter referred to metal X) and a Pd oxide, wherein the Pd oxide includes a Pd monoxide and a Pd dioxide, and wherein a ratio of the Pd atom to a total of the metal X atom and the Pd atom which are contained in the recording layer is 4 to 85 atomic %.

19 Claims, 1 Drawing Sheet

RESULTS OF Pd $3d_{5/2}$ PEAK SEPARATION OF OUTERMOST SURFACE

| PdO | | $PdO_2$ | |
|---|---|---|---|
| PEAK POSITION | AREA RATIO | PEAK POSITION | AREA RATIO |
| 336.9 eV | 69.2% | 338.6 eV | 30.8% |

(56) References Cited

U.S. PATENT DOCUMENTS

| | | |
|---|---|---|
| 2006/0222810 A1 | 10/2006 | Hayashi et al. |
| 2006/0246251 A1 | 11/2006 | Suda |
| 2007/0170434 A1 | 7/2007 | Inoue et al. |
| 2009/0046566 A1 | 2/2009 | Fujii et al. |
| 2010/0055375 A1 | 3/2010 | Sasa et al. |
| 2010/0178446 A1 | 7/2010 | Fujii et al. |
| 2010/0227107 A1 | 9/2010 | Ido et al. |
| 2011/0064903 A1 | 3/2011 | Miki |
| 2011/0216643 A1 | 9/2011 | Tauchi et al. |
| 2011/0310322 A1 | 12/2011 | Inoue et al. |
| 2011/0311828 A1 | 12/2011 | Inoue et al. |

FOREIGN PATENT DOCUMENTS

| | | |
|---|---|---|
| JP | 2002-225433 | 8/2002 |
| JP | 2003-326848 | 11/2003 |
| JP | 2003-331461 | 11/2003 |
| JP | 2004-90610 | 3/2004 |
| JP | 3499724 | 4/2004 |
| JP | 2005-135568 | 5/2005 |
| JP | 2005-314734 A | 11/2005 |
| JP | 2006-247897 | 9/2006 |
| JP | 2007-196683 | 8/2007 |
| JP | 2007-230207 A | 9/2007 |
| JP | 4110194 | 7/2008 |
| JP | 2008-290309 | 11/2008 |
| JP | 2010-137545 | 6/2010 |
| JP | 2010-218636 A | 9/2010 |
| TW | 200735088 A | 9/2007 |
| TW | 200912924 A | 3/2009 |
| WO | WO 03/101750 A1 | 12/2003 |
| WO | WO 2010/055865 A1 | 5/2010 |
| WO | WO 2010/106946 A1 | 9/2010 |

OTHER PUBLICATIONS

Office Action issued Nov. 6, 2012 in Japanese Patent Application No. 2009-217353 (with English-language translation).

Office Action issued on May 28, 2013 in the corresponding Japanese Patent Application No. 2009-217352 (with English Translation).

Taiwanese Office Action dated Jul. 25, 2013 issued in corresponding Taiwan Patent Application No. 099131634.

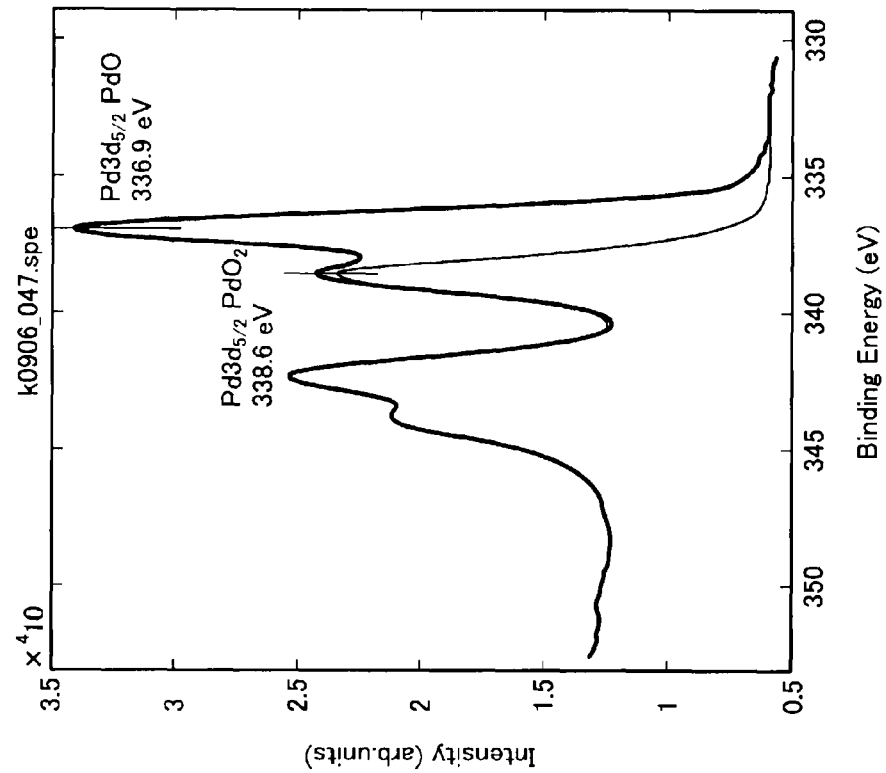

RECORDING LAYER FOR OPTICAL INFORMATION RECORDING MEDIUM, OPTICAL INFORMATION RECORDING MEDIUM, AND SPUTTERING TARGET

CROSS-REFERENCES TO RELATED APPLICATIONS

This application is a National Stage of PCT/JP2010/066099 filed on Sep. 16, 2010. This application is based upon and claims the benefit of priority to Japanese Application No. 2009-217352 filed on Sep. 18, 2009, and to Japanese Application No. 2009-217353 filed on Sep. 18, 2009, the entire contents of which are incorporated herein by reference.

BACKGROUND OF THE INVENTION

1. Technical Field

The present invention relates to a recording layer for an optical information recording medium, an optical information recording medium, and a sputtering target useful for formation of the recording layer.

2. Background Art

An optical information recording medium (optical disc) typically includes optical discs such as CD, DVD and BD, and is divided broadly into three categories of read-only, write-once and rewritable recording media depending on the recording and reading system for them. Of those, the recording system of the write-once optical disc is mainly and broadly divided into a phase change system where the recording layer undergoes phase change, an interlayer reaction system where multiple recording layers are reacted, a system where the compound constituting the recording layer is decomposed, and a perforation system where the recording layer is processed to form recording marks such as holes or pits locally therethrough.

In the phase change system, there has been proposed a material that utilizes the change in the optical properties thereof through crystallization of the recording layer, for the material of the recording layer. For example, Patent Document 1 proposes a recording layer containing Te—O-M (where M is at least one element selected from metal elements, semimetal elements and semiconductor elements); and Patent Document 2 proposes a recording layer containing Sb and Te.

As the recording layer of the optical information recording medium in the interlayer reaction system, for example, Patent Document 3 proposes a recording layer of which the first recording layer includes an alloy containing In—O—(Ni, Mn, Mo) and the second recording layer includes an alloy containing Se and/or Te elements, O (oxygen), and one element selected from Ti, Pd and Zr. Patent Document 4 proposes laminating a first recording layer of a metal mainly including In and a second recording layer of a metal or a nonmetal except oxide containing at least one element belonging to the Group 5B or the Group 6B, and recording thereon through reaction or alloying by heating.

As the recording layer for the system where the compound constituting the recording layer is decomposed, for example, Patent Document 5 proposes a recording layer including a nitride as a main composition thereof, and a material and an organic dye material for recording through decomposition by heating of the nitride have been investigated.

As the recording layer for the perforation system, the layer including a low-melting point metal material has been investigated. For example, Patent Document 6 proposes the layer including an alloy prepared by adding an element of the Group 3B, the Group 4B or the Group 5B to an Sn alloy. Patent Document 7 proposes a recording layer including an Sn-base alloy that contains Ni and/or Co in a range of from 1 to 50 atomic %. Further, Patent Document 8 shows a recording layer including an In alloy containing Co in an amount of from 20 to 65 atomic %, or an In alloy additionally containing at least one element selected from Sn, Bi, Ge and Si in an amount of 19 atomic % or less.

PRIOR ART DOCUMENTS

Patent Documents

Patent Document 1: JP-A 2005-135568
Patent Document 2: JP-A 2003-331461
Patent Document 3: JP-A 2003-326848
Patent Document 4: Japanese Patent No. 3499724
Patent Document 5: WO2003/101750
Patent Document 6: JP-A 2002-225433
Patent Document 7: JP-A 2007-196683
Patent Document 8: Japanese Patent No. 4110194

SUMMARY OF THE INVENTION

Problems that the Invention is to Solve

The necessary properties that are required for optical information recording media are mainly that they have a reflectivity enough for reading, that they accept recording thereon with a practicable recording layer power (they have a high recording sensitivity), that the recording signal has a signal amplitude enough for reading (the signal has a high degree of modulation), that the signal intensity is high (the C/N ratio is high) and the like.

However, the recording materials disclosed as the related art technology could hardly satisfy these necessary properties by the recording materials alone, and in the phase change system, since the reflectivity of the recording layer alone is low, a reflective film for increasing the reflectivity as the optical disc state is necessary, and in addition, for increasing the degree of modulation, a dielectric layer of $ZnS$—$SiO_2$ or the like must be arranged above and below the recording layer, or that is, the number of the layers constituting the optical disc increases. In addition, also in the interlayer reaction system, multiple recording layers are needed, and therefore the number of the layers constituting the optical disc increases. Accordingly, there is a problem in that the number of the film layers increases and the productivity lowers. In contrast to this, in the perforation system, the reflectivity of the recording layer itself is high and the layer can secure a large degree of modulation, and therefore the number of the layers constituting the optical disc can be reduced; however, for attaining a higher recording sensitivity, further investigations are needed. In addition, the recording layer is required to have durability (especially durability at high temperature and high humidity).

The invention has been made in consideration of the situation as above, and an object thereof is to provide a recording layer for an optical information recording medium which satisfies the above-mentioned necessary properties with reducing the number of the layers of an optical disc and which can increase the productivity of an optical information recording medium; to provide an optical information recording medium including the recording layer and excellent in the durability of the recording layer (especially in the durability thereof at high temperature and high humidity), and to provide a sputtering target useful for formation of the recording layer.

Means for Solving the Problems

The invention encompasses the following embodiments.

(1) A recording layer for an optical information recording medium on which recording is performed through irradiation with a laser light, the recording layer comprising:

an oxide of a metal X of which an absolute value of the standard free energy of oxide formation per 1 mol of oxygen is larger than that of Pd; and a Pd oxide, wherein the Pd oxide comprises a Pd monoxide and a Pd dioxide, and wherein a ratio of the Pd atom contained in the recording layer to a total of the metal X atom and the Pd atom which are contained in the recording layer is from 4 to 85 atomic %.

(2) The recording layer for an optical information recording medium according to (1), wherein the metal X is at least one selected from the group consisting of Sn, Zn, Bi, Ge, Co, W, Cu and Al.

(3) The recording layer for an optical information recording medium according to (1) or (2), wherein a ratio of the Pd dioxide to a total of the Pd monoxide and the Pd dioxide is from 5 to 70 mol %.

(4) The recording layer for an optical information recording medium according to any one of (1) to (3), which has a thickness of from 5 to 100 nm.

(5) The recording layer for an optical information recording medium according to any one of (1) to (4), wherein a bubble is formed in a part which is irradiated with the laser light to undergo volume change therein, thereby performing recording.

(6) An optical information recording medium comprising a recording layer on which recording is performed through irradiation with a laser light, wherein the recording layer comprises: an oxide of a metal X of which an absolute value of the standard free energy of oxide formation per 1 mol of oxygen is larger than that of Pd; and a Pd oxide, wherein the Pd oxide comprises a Pd monoxide and a Pd dioxide, and wherein a ratio of the Pd atom contained in the recording layer to a total of the metal X atom and the Pd atom which are contained in the recording layer is from 4 to 85 atomic %.

(7) The optical information recording medium according to (6), further comprising a dielectric layer formed adjacent to the recording layer.

(8) The optical information recording medium according to (6) or (7), wherein the metal X contained in the recording layer is at least one selected from the group consisting of Sn, Zn, Bi, Ge, Co, W, Cu and Al.

(9) The optical information recording medium according to any one of (6) to (8), wherein a ratio of the Pd dioxide contained in the recording layer to a total of the Pd monoxide and the Pd dioxide which are contained in the recording layer is from 5 to 70 mol %.

(10) The optical information recording medium according to any one of (7) to (9), wherein the dielectric layer contains an oxide, a nitride, a sulfide, a carbide or a mixture thereof.

The optical information recording medium in the above (10) is preferably the optical information recording medium according to any one of (7) to (9), wherein the dielectric layer consist essentially of an oxide, a nitride, a sulfide, a carbide or a mixture thereof, and is more preferably the optical information recording medium according to any one of (7) to (9), wherein the dielectric layer consist of an oxide, a nitride, a sulfide, a carbide or a mixture thereof.

(11) The optical information recording medium according to (10), wherein the oxide contained in the dielectric layer is an oxide of at least one element selected from the group consisting of In, Zn, Sn, Al, Si, Ge, Ti, Ga, Ta, Nb, Hf, Zr, Cr, Bi and Mg, the nitride contained in the dielectric layer is a nitride of at least one element selected from the group consisting of Si, Ge and Ti, the sulfide contained in the dielectric layer is a Zn sulfide, and the carbide contained in the dielectric layer is a carbide of at least one element selected from the group consisting of Si, Ti and W.

(12) The optical information recording medium according to any one of (7) to (11), wherein a thickness of the dielectric layer is from 2 to 40 nm.

(13) The optical information recording medium according to any one of (6) to (12), wherein a thickness of the recording layer is from 5 to 100 nm.

(14) The optical information recording medium according to any one of (6) to (13), wherein a bubble is formed in a part of the recording layer which is irradiated with the laser light to undergo volume change therein, thereby performing recording.

(15) A sputtering target for formation of the recording layer as described in any one of (1) to (14), the sputtering target containing:

an oxide of a metal X; and Pd, wherein a ratio of the Pd atom contained in the sputtering target to a total of the metal X atom and the Pd atom which are contained in the sputtering target is from 4 to 85 atomic %.

(16) A sputtering target for formation of the recording layer as described in any one of (1) to (14), the sputtering target comprising:

an alloy that contains Pd in an amount of from 4 to 85 atomic % in terms of a ratio of a Pd atom to a total of a metal X atom and the Pd atom.

(17) The sputtering target according to (15) or (16), wherein the metal X is at least one selected from the group consisting of Sn, Zn, Bi, Ge, Co, W, Cu and Al.

Advantage of the Invention

The invention can provide a recording layer for an optical information recording medium (especially a recording layer for a write-once optical information recording medium) excellent in the recording sensitivity with a practicable recording laser power, and an optical information recording medium (especially a write-once optical information recording medium) including the recording layer and excellent in durability of the recording layer. Also, the invention can provide a sputtering target useful for formation of the recording layer.

In the description, "excellent in recording sensitivity" means that a high degree of modulation with a relatively low recording laser power can be realized, as described in detail in the section of Examples given hereinunder.

BRIEF DESCRIPTION OF THE DRAWING

FIG. 1 Analysis results of the state of Pd in Example 1 (Pd $3d_{5/2}$ photoelectron spectra).

EMBODIMENTS FOR CARRYING OUT THE INVENTION

The present inventors have made assiduous studies for the purpose of realizing a recording layer for an optical information recording medium more excellent in the recording sensitivity with a practicable recording laser power and more excellent in the durability thereof, than already-existing recording layers. As a result, the inventors have found that, when a recording layer containing an oxide of a metal (referred to as a metal X, hereinbelow) of which an absolute value of the standard free energy of oxide formation per 1 mol of oxygen is larger than that of Pd and a Pd oxide, wherein the Pd oxide includes Pd monoxide and Pd dioxide, is provided different from already-existing recording layers, and when the recording layer is irradiated with laser, then the Pd oxide is heated by the laser irradiation and decomposed to release oxygen thereby forming bubbles in the part which is irradiated with the laser light to enable irreversible recording therein, that the recording system is a system capable of more dramatically increasing the recording sensitivity than before, and that, when a dielectric layer is formed adjacent to the recording layer, then the durability of the recording layer can be dramatically enhanced.

In the recording system by the recording layer, the structure of the recording layer before laser irradiation is amorphous, and even after laser irradiation, the structure is still amorphous; and in this point, the system differs from the phase change system that utilizes change of an amorphous state into crystal through laser irradiation.

The reason why the recording layer of the invention is excellent in recording sensitivity may be considered as follow: the transmittance of the part where bubbles have been formed through laser irradiation may increase (that is, the reflectivity thereof may lower) as compared with that of the part where no bubble have been formed, and therefore the degree of modulation in the part could be thereby increased.

In addition, the Pd oxide is contained as described above, and therefore, as compared with the case where a Pd oxide is not contained, the refractivity thereof can be thereby increased. Further, since the light absorptance of the film can be increased, the laser energy for signal recording can be efficiently converted into heat and, as a result, the decomposition of the Pd oxide can be promoted with a practicable recording laser power, thereby sufficiently increasing the recording sensitivity.

For sufficiently expressing these effects, the ratio of the Pd atom to the total of the metal atom of which the absolute value of the standard free energy of oxide formation per 1 mol of oxygen is larger than that of Pd (hereinafter this may be referred to as "Pd content") must be 4 atomic % or more. When the Pd content is lower than 4 atomic %, then the Pd oxide to be decomposed during laser irradiation is small and therefore the oxygen amount to be released is not sufficient and the amount of the bubbles to be formed is small, and as a result, the signal intensity is low. In addition, the light absorptance of the recording layer is also low and the laser power necessary for recording increases unfavorably. The Pd content is preferably 8 atomic % or more, more preferably 10 atomic % or more. On the other hand, when the Pd content is more than 85 atomic %, the degree of modulation lowers, and therefore, in the invention, the upper limit of the Pd content is 85 atomic %. The upper limit of the Pd content is preferably 50 atomic %, more preferably 45 atomic %.

In a multilayer optical disc having two or more recording layers, the recording layers except the recording layer farthest one from the laser incidence plane thereof are required to have transmittance, but the transmittance can be increased by reducing the Pd content. Accordingly, in the recording layer that is required to have a certain level of transmittance, the Pd content is preferably within a range of from 4 to 30 atomic %. On the other hand, a single-layer disc or the lowermost layer of a multilayer disc (the recording layer farthest from the laser incidence plane thereof) is required to have a certain level of reflectivity, and therefore the Pd content therein is preferably from 30 to 85 atomic %.

In the case where the Pd oxide includes especially Pd monoxide and Pd dioxide, then the recording sensitivity can be more sufficiently increased. The reason would be because Pd dioxide more unstable than Pd monoxide could be more readily decomposed through laser irradiation to release oxygen, and since Pd dioxide is made to exist in Pd monoxide that is more stable than Pd dioxide, the spontaneous decomposition of the Pd dioxide could be prevented and the a stable recording layer could be obtained.

For increasing the oxygen release amount through decomposition of the Pd dioxide to thereby attain a sufficient reflectivity change by recording, or for increasing the recording sensitivity, the ratio of the Pd dioxide to the total of the Pd monoxide and the Pd dioxide is preferably 5 mol % or more. On the other hand, when the amount of the Pd dioxide is too excessive compared to that of the Pd monoxide, then the Pd dioxide could not exist stably whereby the formation of the recording layer would be difficult. Consequently, the ratio of the Pd dioxide to the total of the Pd monoxide and the Pd dioxide is preferably 70 mol % or less, more preferably 60 mol % or less.

The recording layer of the invention contains, along with the above-mentioned Pd oxide, an oxide of a metal (metal X) of which the absolute value of the standard free energy of oxide formation per 1 mol of oxygen is larger than that of Pd. In that manner, a metal oxide more stable than Pd oxide is contained therein along with Pd oxide, and therefore, the morphology change through oxygen release during the decomposition of the Pd oxide can be clarified and enlarged, whereby a sufficient reflectivity change by recording can be realized and the recording sensitivity can be increased.

As the metal (metal X) of which the absolute value of the standard free energy of oxide formation per 1 mol of oxygen is larger than that of Pd, examples thereof include Sn, Zn, Bi, Ge, Co, W, Cu and Al (the standard free energy of oxide formation per 1 mol of oxygen at room temperature of Pd is about −150 kJ/mol, and those of Sn, Zn, Bi, Ge, Co, W, Cu and Al are −520, −640, −330, −420, −420, −500, −270 and −1050 kJ/mol, respectively). With regard to the standard free energy of oxide formation per 1 mol of oxygen, for example, that of Al is:

a value in reaction of $\frac{4}{3}Al+O_2=\frac{2}{3}Al_2O_3$;

and that of Zn is:

a value in reaction of $2Zn+O_2=2ZnO$.

As described above, the recording layer of the invention contains an oxide of the metal X, preferably contains an oxide of the metal X in an amount of 50 mol % or more. The recording layer of the invention may contain, in addition to the oxide of the above-mentioned metal X and the above-mentioned Pd oxide, any inevitable impurities that may inevitably mix therein during the layer formation. Further, for the purpose of increasing the absorptance and controlling the reflectivity thereof, the layer may contain Sn, Al, Bi, Cu, Nb, Ti, Si or Ta in a state of an oxide thereof or a metal itself within a range of 30 atomic % or less in total.

The thickness of the recording layer may vary depending on the structure of the optical information recording medium where any other layer such as a metal compound layer or a metal layer may be inserted above/below the recording layer, but preferably, the thickness of the recording layer is from 5 to 100 nm. When the thickness of the recording layer is smaller than 5 nm, a sufficient reflectivity change by recording may hardly be attained. More preferably, the thickness is 10 nm or more, even more preferably 20 nm or more, still more preferably 25 nm or more. On the other hand, when the thickness of the recording layer is more than 100 nm, then the film formation may take a lot of time and the productivity may lower and, in addition, the laser power necessary for recording may increase. More preferably, the thickness is 70 nm or less, even more preferably 60 nm or less.

As described above, the recording layer of the invention contains a Pd oxide (for example, PdO, $PdO_2$, $PdO_x$ or the like), and for forming such a recording layer, the recording layer is preferably formed by a sputtering method. The sputtering method is favorable as securing the film thickness distribution uniformity in the disc plane.

For forming the recording layer containing Pd oxide by the sputtering method, the sputtering condition is preferably such that the ratio of the oxygen flow rate to the Ar (argon) flow rate is from 0.5 to 10.0. The other condition in the sputtering method is not specifically limited, and any ordinary method can be employable. For example, the gas pressure may be controlled to fall within a range of from 0.1 to 1.0 Pa, and the sputtering power may be, for example, within a range of from 0.5 to 20 $W/cm^2$.

As the sputtering target (hereinafter this may be simply referred to as "target") for use in the sputtering method includes:

(A) a sputtering target containing an oxide of a metal X (preferably at least one selected from the group consisting of Sn, Zn, Bi, Ge, Co, W, Cu and Al) (concretely, for example, containing an oxide of a metal X in an amount of 50 mol % or more), and Pd (for example, Pd oxide and/or metal Pd), in which the ratio of the Pd atom to the total of the metal X atom and the Pd atom is from 4 to 85 atomic %; and (B) a sputtering target including an a metal X-base alloy that contains Pd (for example, metal Pd) in an amount of from 4 to 85 atomic % in terms of the ratio of the Pd atom to the total of the atom of the metal X (preferably at least one selected from the group consisting of Sn, Zn, Bi, Ge, Co, W, Cu and Al) and the Pd atom. In addition, (C) a metal X target (pure metal X target) and a metal Pd target (pure metal Pd target) may be used, and these may be discharged simultaneously for multicomponent sputtering.

As the sputtering target (A), use of one that is prepared by mixing a powder of the oxide of metal X and a powder of metal Pd, followed by sintering the mixture, is preferable from the viewpoint of the productivity and of the in-plane uniformity of the composition of the formed thin film and the thickness controllability thereof. When producing the sputtering target, a small amount of impurities may mix in the sputtering target. However, the composition of the sputtering target of the invention does not define even the minor compositions inevitably mixing therein, as long as the properties of the invention are not impaired, the mix of a small amount of the inevitable impurities could be allowed.

The optical information recording medium of the invention is characterized by including the above-mentioned recording layer, and is not specifically defined in point of the other configuration thereof except the recording layer, and consequently, any configuration known in the art of optical information recording media is employable.

Another embodiment of the optical information recording medium of the invention is characterized by including the above-mentioned recording layer and by additionally including a dielectric layer mentioned below, which is formed adjacent to the recording layer.

Another embodiment of the optical information recording medium of the invention includes the recording layer having excellent properties as above but must keep the excellent properties even in high-temperature high-humidity environments, or that is, must secure excellent durability. Accordingly in the invention, a dielectric layer is formed adjacent to the recording layer. In the above-mentioned environments, the Pd oxide in the part which is not irradiated with laser (that is, recording is not performed thereon) may be gradually reduced to release oxygen and, as a result, the optical properties thereof may change and the reflectivity thereof may lower, and this would be a reason for durability reduction. However, when a dielectric layer is formed adjacent to the recording layer, then it could prevent any unnecessary decomposition of the Pd oxide (especially Pd dioxide) in the recording layer and the oxide could be kept stable.

As the embodiment where "a dielectric layer is formed adjacent to the recording layer", examples thereof include a case where the dielectric layer is formed between the substrate and the recording layer and adjacent to the recording layer and/or a case where the dielectric layer is formed between the recording layer and the light-transmissive layer to be mentioned hereinunder and adjacent to the recording layer.

The dielectric layer acts as an oxygen barrier layer to thereby enhance the durability. By preventing oxygen in the recording layer from scuttling away, the reflectivity change (especially the reflectivity reduction) is prevented, and thus, the necessary reflectivity of the recording layer can be secured.

Further, the recording properties can be enhanced by forming the dielectric layer. This would be because, the thermal diffusion of the incident laser could be optimally controlled by the dielectric layer and therefore the bubbles in the recording part could be prevented from growing too large and the decomposition of Pd oxide is prevented from being too much promoted so that the bubbles are crushed, whereby the form of the bubble could be optimized.

As the material of the dielectric layer, examples thereof include oxides, nitrides, sulfides, carbides, fluorides or their mixtures. As the oxides, examples thereof include oxides of at least one element selected from the group consisting of In, Zn, Sn, Al, Si, Ge, Ti, Ga, Ta, Nb, Hf, Zr, Cr, Bi and Mg. As the nitrides, examples thereof include nitrides of at least one element selected from the group consisting of In, Sn, Ge, Cr, Si, Al, Nb, Mo, Ti, W, Ta and Zn (preferably nitrides of at least one element selected from the group consisting of Si, Ge and Ti); as the sulfides, examples thereof include Zn sulfide. As the carbides, examples thereof include carbides of at least one element selected from the group consisting of In, Sn, Ge, Cr, Si, Al, Ti, Zr, Ta and W (preferably carbides of at least one element selected from the group consisting of Si, Ti and W); and as the fluorides, examples thereof include fluorides of at least one element selected from the group consisting of Si, Al, Mg, Ca and La. As their mixtures, examples thereof include $ZnS—SiO_2$. Of those, the above-mentioned compounds (oxides and the like) containing at least any one of In, Zn, Sn, Al, Si, Ti and Mg or their mixtures are preferable; and the above-mentioned compounds containing at least any one of In, Zn, Sn and Al or their mixtures are more preferable.

The thickness of the dielectric layer is preferably from 2 to 40 nm. This is because, when the thickness thereof is less than 2 nm, the dielectric layer could not sufficiently exhibit the effect thereof (especially the effect thereof as oxygen barrier). More preferably, the thickness is 3 nm or more. On the other hand, when the thickness of the dielectric layer is too large, it is unfavorable since the recording layer could hardly change (formation of bubbles) by the laser irradiation whereby the recording properties thereof would be lowered. Accordingly, the thickness of the dielectric layer is preferably 40 nm or less, more preferably 35 nm or less.

The invention does not restrict the method for forming the dielectric layer; however, the dielectric layer is preferably formed by the sputtering method like the recording layer.

When forming the dielectric layer by the sputtering method, the sputtering condition may be as follows. The Ar flow rate may be within a range of from 10 to 100 sccm; in the case where a metal target mentioned below is used, the oxygen flow rate when forming the oxide layer may be within a range of from 5 to 60 sccm, and the nitrogen flow rate when forming the nitride layer may be within a range of from 5 to 80 sccm. The gas pressure may be within a range of from 0.1 to 1.0 Pa; and the sputtering power may be, for example, within a range of from 0.5 to 50 W/cm$^2$.

The sputtering target to be used when forming the dielectric layer includes targets of the above-mentioned compounds (oxides, nitrides, sulfides, carbides, fluorides), as well as other metal targets containing any element other than oxygen, nitrogen, sulfur, carbon and fluorine in the above-mentioned compounds (pure metal or alloy targets).

The configuration of the optical information recording medium of the invention is not specifically defined except for the recording layer and the dielectric layer therein, and any configuration known in the art of optical information recording media can be employed.

Regarding the configuration of the information recording medium (optical disc), examples thereof include a laminate structure in which a recording layer and a dielectric layer are laminated on a substrate having laser guide grooves formed thereon, and a light-transmissive layer further laminated thereon.

As the material of the substrate, examples thereof includes polycarbonate resins, norbornene resins, cyclic olefin copolymers, amorphous polyolefins, etc. For the light-transmissive layer, polycarbonates and UV-curable resins are usable. It is preferred that the material of the light-transmissive layer has a high transmittance to the laser for recording and reading and the light absorptance thereof is small. The thickness of the substrate may be, for example, from 0.5 to 1.2 mm. The thickness of the light-transmissive layer may be, for example, from 0.1 to 1.2 mm.

The recording layer of the invention has a high reflectivity and shows excellent recording properties by itself, but if desired, for the purpose of enhancing the durability of the recording layer, an oxide layer, a sulfide layer, a metal layer or the like may be provided above and/or below the recording layer. Laminating these layers prevents the time degradation of oxidation or decomposition of the recording layer. For further increasing the reflectivity of the optical disc, an optical regulation layer may be provided between the substrate and the recording layer. As the material of the optical regulation layer, examples thereof include Ag, Au, Cu, Al, Ni, Cr, Ti and their alloys.

In the above, one-layer type optical disc in which one recording layer and one light-transmissive layer are formed are described, but it is not limited thereto, and also includes two or more layers type optical disc in which two or more recording layers and two or more light-transmissive layers are laminated.

In the case of two or more layers type optical disc, a transparent interlayer formed of, for example, a transparent resin such a UV-curable resin or a polycarbonate may be included between one recording layer group that includes a recording layer and, as optionally laminated thereon, an optical regulation layer and a dielectric layer, and another recording layer group.

The invention is characterized by employing the above-mentioned recording layer, or along with employing the above-mentioned recording layer, by forming a dielectric layer adjacent to the recording layer, and the method for forming the substrate and the light-transmissive layer and further the optical regulation layer, the dielectric layer, the transparent interlayer and others except the recording layer and the dielectric layer is not specifically defined. According to any ordinary method, therefore, the optical information recording medium may be prepared.

The optical information recording medium includes CD, DVD and BD, and for example, BD-R is mentioned as a concrete example thereof capable of recording and reading data by irradiating the recording layer thereof with a blue laser light having a wavelength of from about 380 nm to 450 nm, preferably about 405 nm.

EXAMPLES

The invention is more specifically described below with reference to Examples, but it should not be construed that the invention is limited to the following Examples. The invention can also be practiced by applying modifications within a range adaptable to the purports described above and described below, and all of them are included in the technical scope of the invention.

Example 1

(1) Production of Optical Disc

As a disc substrate, a polycarbonate substrate (thickness, 1.1 mm; diameter, 120 mm; track pitch, 0.32 μm; groove depth, 25 nm) was used. According to a DC magnetron sputtering method, a recording layer was formed on the substrate, in which the content of the oxide of the metal X and that of the Pd oxide were varied (the molar ratio of Pd monoxide and Pd dioxide to the total of Pd monoxide and Pd dioxide is shown in Table 1). The thickness of the recording layer was 40 nm. The sputtering was multicomponent sputtering in which multiple targets of a pure metal X (Sn, Zn, Bi, In, Ge, Co, W, Cu) target and a pure Pd metal target were simultaneously discharged. The sputtering condition for forming the recording layer was: Ar flow rate of 10 sccm or 15 sccm, and oxygen flow rate of 15 sccm or 24 sccm. The gas pressure was from 0.3 to 0.6 Pa, the DC sputtering power was from 100 to 200 W, and the substrate temperature was room temperature.

The composition (Pd content) of the deposited recording layer was analyzed according to ICP emission analysis, fluorescent X-ray analysis or X-ray photoemission spectroscopy.

Next, a UV-curable resin ("BRD-864" manufactured by Nippon Kayaku Co., Ltd.) was applied onto the obtained recording layer according to a spin coating method, followed by irradiating with UV rays to form a light-transmissive layer having a thickness of about 0.1 mm, thereby producing an optical disc.

The Pd state was analyzed as follows. Specifically, according to X-ray photoemission spectroscopy (using an apparatus of Quantera SXM manufactured by Physical Electronics), the outermost surface spectrum of the recording layer was determined through measurement, the Pd $3d_{5/2}$ photoelectron spectrum was analyzed through peak separation; and from the peak area ratio, the existence form of Pd existing in the recording layer, that is, the molar ratio (mol %) of metal Pd, Pd monoxide and Pd dioxide was determined. For the charging correction, the photoelectron from the C1s level was taken as the standard. The light-transmissive layer (cover layer) was peeled from the optical disc, and the recording layer formed on the polycarbonate substrate was analyzed as such, and the analyzed area was about φ200 μm. As one example of the spectrum, the Pd $3d_{5/2}$ photoelectron spectrum of No. 2 in Table 1 is shown in FIG. 1.

(2) Evaluation of Optical Disc

The prepared optical disc was evaluated as follows. Specifically, an optical disc evaluation apparatus ("ODU-1000" manufactured by Pulstec Industry Co., Ltd.) was used, the center wavelength of the recording laser was 405 nm, and a lens having NA (numerical aperture) of 0.85 was used. Using the apparatus, laser was applied onto the track, and from the reflected light intensity in the unrecorded part of the optical disc, the reflectivity mentioned below was determined.

Using the above-mentioned optical disc evaluation apparatus, a random signal from 2 T to 8 T was recorded with a different recording laser power (recording power) under the condition of a linear velocity of 4.92 m/s and a standard clock of 66 MHz. Using Time Interval Analyzer TA810 manufactured by Yokogawa Electric Corporation, the jitter value (this indicates the fluctuation on the time axis of reading signal during recording and reading with reading laser power of 0.3 mW) was measured, and the recording laser power (recording power) with which the jitter value is the smallest was determined (the value is shown in Table 1). The degree of modulation at the recording power with which the jitter value was the smallest (rate of reflectivity change) was determined according to the following formula (I). Those of which the degree of modulation was 0.40 or more were accepted as good.

Degree of Modulation(rate of reflectivity change)=
(reflectivity in unrecorded part−reflectivity in recorded part)/(reflectivity in unrecorded part).  (1)

Example 2

(1) Production of Optical Disc

As a disc substrate, a polycarbonate substrate (thickness, 1.1 mm; diameter, 120 mm; track pitch, 0.32 μm; groove depth, 25 nm) was used. Nos. 4 to 10 were prepared as follows. According to a DC magnetron sputtering method, a dielectric layer (lower layer) having the composition and the thickness shown in Table 2 was formed using an oxide target or a pure metal target. The sputtering condition for forming the dielectric layer (lower layer) was: Ar flow rate of 10 sccm to 30 sccm, oxygen flow rate (in the case where the pure metal target was used) of 0 sccm to 10 sccm, gas pressure of from 0.2 to 0.4 Pa, DC sputtering power of from 100 to 400 W, and substrate temperature of room temperature.

Next a recording layer was formed. Circumstantially, a recording layer was formed on the substrate (in Nos. 4 to 10, on the dielectric layer (lower layer)) according to a DC magnetron sputtering method. The thickness of the recording layer was 40 nm. The sputtering was multicomponent sputtering in which two targets of a pure metal X (Zn, W, Sn, Cu) target and a pure Pd metal target were simultaneously discharged. The sputtering condition for forming the recording layer was: Ar flow rate of 10 sccm, oxygen flow rate of 15 sccm, gas pressure of 0.4 Pa, DC sputtering power of from 100 to 200 W, and substrate temperature of room temperature.

Then, Nos. 3 and 5 to 13 in Table 2 were prepared as follows: Like the above-mentioned dielectric layer (lower layer), a dielectric layer (upper layer) having the composition and the thickness shown in Table 2 was formed using an oxide target or a pure metal target.

TABLE 1

| No. | Oxide of metal X in recording layer | Ratio (atomic ratio) of two or more elements X, if any | Gas flow rate in deposition (sccm) Ar | O$_2$ | Pd content*1 [atomic %] | Pd ratio in each state (mol %) metal Pd | Pd monoxide | Pd dioxide | Mol % of Pd dioxide*2 | Recording power (mW) | Degree of modulation (ratio) |
|---|---|---|---|---|---|---|---|---|---|---|---|
| 1 | Zn oxide | — | 10 | 15 | 47.6 | 0 | 77.8 | 22.2 | 22.2 | 4.7 | 0.51 |
| 2 | Sn oxide + Zn oxide | Sn/Zn = 50/50 | 10 | 15 | 37.1 | 0 | 69.2 | 30.8 | 30.8 | 4.8 | 0.47 |
| 3 | Bi oxide | — | 10 | 15 | 12.6 | 0 | 28 | 72 | 72.0 | 3.7 | 0.6 |
| 4 | In oxide + Ge oxide | In/Ge = 75/25 | 10 | 15 | 58.2 | 0 | 78.1 | 21.9 | 21.9 | 3.9 | 0.54 |
| 5 | In oxide + Co oxide | In/Co = 75/25 | 10 | 15 | 41.8 | 0 | 71.1 | 28.9 | 28.9 | 4.1 | 0.47 |
| 6 | Zn oxide + Sn oxide | Zn/Sn = 80/20 | 10 | 15 | 42.6 | 0 | 77.8 | 22.2 | 22.2 | 4.8 | 0.46 |
| 7 | Zn oxide + W oxide | Zn/W = 72/28 | 15 | 24 | 20.5 | 0 | 71.1 | 28.9 | 28.9 | 5.2 | 0.41 |
| 8 | Cu oxide + W oxide | Cu/W = 55/45 | 15 | 24 | 44.1 | 0 | 82.5 | 17.5 | 17.5 | 3.5 | 0.4 |

*1: Ratio of Pd atom contained in the recording layer to the total of metal X atom and Pd atom which are contained in the recording layer.
*2: 100 × mol % of Pd dioxide/(mol % of Pd monoxide + mol % of Pd dioxide).

From Table 1, it is known that the recording layer containing an oxide of a metal (metal X) of which the absolute value of the standard free energy of oxide formation per 1 mol of oxygen is larger than that of Pd, such as Zn oxide and Sn oxide, and a Pd oxide, wherein the Pd oxide includes Pd monoxide and Pd dioxide, secures a high degree of modulation and an excellent recording sensitivity with a practicable recording laser power.

Next, a UV-curable resin ("BRD-864" manufactured by Nippon Kayaku Co., Ltd.) was applied onto the recording layer in Nos. 1, 2 and 4 and onto the dielectric layer (upper layer) in Nos. 3 and 5 to 13 according to a spin coating method, followed by irradiating with UV rays to form a light-transmissive layer having a thickness of about 0.1 mm, thereby producing an optical disc.

Separately, it was confirmed that the recording layer contained In oxide and Pd oxide and the Pd oxide included Pd monoxide and Pd dioxide.

(2) Evaluation of Optical Disc

The durability of the prepared optical disc was evaluated in the manner mentioned below.

Using an optical disc evaluation apparatus ("ODU-1000" manufactured by Pulstec Industry Co., Ltd.; recording laser wavelength, 405 nm; NA (numerical aperture), 0.85), laser was applied onto the track, and from the reflected light intensity in the unrecorded part of the optical disc, the reflectivity (initial reflectivity) at a wavelength of 405 nm was determined through conversion.

An accelerated environmental test (constant temperature and humidity test) in which the disc was kept in an air atmosphere at a temperature of 80° C. and a relative humidity of 85% for 96 hours was performed, and after the test, the reflectivity was measured in the same manner as above. The results are shown in Table 2.

TABLE 2

| No. | Dielectric layer (lower layer) Composition | Thickness (nm) | Recording layer Oxide of metal X in Recording Layer | Pd content*1 (atomic %) | Ratio (atomic ratio) of two or more elements X, if any | Thickness (nm) | Dielectric layer (upper layer) Composition | Thickness (nm) | Initial reflectivity (%) | Reflectivity after test (%) | Rate of reflectivity change*2 (%) |
|---|---|---|---|---|---|---|---|---|---|---|---|
| 1 | — | — | Zn oxide | 40 | — | 35 | — | — | 14.3 | 10.8 | −0.24 |
| 2 | — | — | W oxide | 60 | — | 35 | — | — | 12.3 | 10.3 | −0.16 |
| 3 | — | — | Zn oxide | 40 | — | 35 | In oxide ($In_2O_3$) | 8 | 13.4 | 11.1 | −0.17 |
| 4 | In oxide ($In_2O_3$) | 8 | Zn oxide | 40 | — | 35 | — | — | 12.7 | 11.2 | −0.12 |
| 5 | In oxide ($In_2O_3$) | 8 | Zn oxide | 40 | — | 35 | In oxide ($In_2O_3$) | 8 | 13.3 | 12.7 | −0.05 |
| 6 | Si oxide ($SiO_2$) | 8 | Zn oxide | 40 | — | 35 | Si oxide ($SiO_2$) | 8 | 14.8 | 14.0 | −0.05 |
| 7 | Ti oxide ($TiO_2$) | 8 | Zn oxide | 40 | — | 35 | Ti oxide ($TiO_2$) | 8 | 9.6 | 8.9 | −0.07 |
| 8 | Sn oxide ($SnO_2$) | 8 | Zn oxide | 40 | — | 35 | Sn oxide ($SnO_2$) | 8 | 13.7 | 12.9 | −0.06 |
| 9 | In oxide ($In_2O_3$) | 8 | Zn oxide + Sn oxide | 40 | Zn/Sn = 75/25 | 35 | In oxide ($In_2O_3$) | 8 | 5.7 | 5.5 | −0.04 |
| 10 | In oxide ($In_2O_3$) | 8 | W oxide | 60 | — | 35 | In oxide ($In_2O_3$) | 8 | 10.6 | 10.1 | −0.05 |
| 11 | — | — | W oxide + Zn oxide | 27 | W/Zn = 12/88 | 40 | TiN | 10 | 11.8 | 10.9 | −0.08 |
| 12 | — | — | W oxide + Cu oxide | 25.5 | W/Cu = 22/78 | 40 | TiN | 10 | 12.4 | 12.7 | 0.02 |
| 13 | — | — | W oxide + Zn oxide + Cu oxide | 32.2 | W/Zn/Cu = 21/37/42 | 40 | TiN | 10 | 11.9 | 11.6 | −0.03 |

*1: Ratio of Pd atom contained in the recording layer to the total of metal X atom and Pd atom which are contained in the recording layer.
*2: (Reflectivity after Test [%] − Initial Reflectivity [%])/Initial Reflectivity [%].

From Table 2, it is known that forming the dielectric layer adjacent to the recording layer makes it possible to sufficiently reduce the reflectivity change than the case where the dielectric layer is not formed, and therefore makes it possible to realize an optical information recording medium excellent in durability.

While the invention has been described in detail and with reference to specific embodiments thereof, it will be apparent to one skilled in the art that various changes and modifications can be made therein without departing from the spirit and scope thereof.

This application is based on Japanese Patent Application No. 2009-217352 filed on Sep. 18, 2009, and Japanese Patent Application No. 2009-217353 filed on Sep. 18, 2019, and the entire subject matter of which is incorporated herein by reference.

INDUSTRIAL APPLICABILITY

The invention can provide a recording layer for an optical information recording medium (especially a recording layer for a write-once optical information recording medium) excellent in the recording sensitivity with a practicable recording laser power, and an optical information recording medium (especially a write-once optical information recording medium) including the recording layer and excellent in durability of the recording layer. Also, the invention can provide a sputtering target useful for formation of the recording layer.

The invention claimed is:

1. A recording layer for an optical information recording medium, the recording layer comprising:
   an oxide of a metal X of which an absolute value of the standard free energy of oxide formation per 1 mol of oxygen is larger than that of Pd; and
   a Pd oxide comprising a Pd monoxide and a Pd dioxide,
   wherein a ratio of the Pd atom contained in the recording layer to a total of the metal X atom and the Pd atom which are contained in the recording layer is from 4 to 85 atomic %,
   with the proviso that:
      a recording layer composed of an In oxide and a Pd oxide; and
      a recording layer composed of an In oxide, a Pd oxide and metal Pd, are excluded.

2. The recording layer according to claim 1, wherein the metal X is at least one selected from the group consisting of Sn, Zn, Bi, Ge, Co, W, Cu and Al.

3. The recording layer according to claim 1, wherein a ratio of the Pd dioxide to a total of the Pd monoxide and the Pd dioxide is from 5 to 70 mol %.

4. The recording layer according to claim 1, which has a thickness of from 5 to 100 nm.

5. The recording layer according to claim 1, further comprising a bubble formed in a part of the recording layer which, when irradiated with laser light, undergoes a volume change, thereby recording.

6. An optical information recording medium, comprising the recording layer according to claim 1.

7. The optical information recording medium according to claim 6, further comprising a dielectric layer formed adjacent to the recording layer.

8. The optical information recording medium according to claim 6, wherein the metal X is at least one selected from the group consisting of Sn, Zn, Bi, Ge, Co, W, Cu and Al.

9. The optical information recording medium according to claim 6, wherein a ratio of the Pd dioxide to a total of the Pd monoxide and the Pd dioxide is from 5 to 70 mol %.

10. The optical information recording medium according to claim 7, wherein the dielectric layer comprises an oxide, a nitride, a sulfide, a carbide or a mixture thereof.

11. The optical information recording medium according to claim 10, wherein the dielectric layer comprises at least one selected from the group consisting of:
- an oxide of at least one element selected from the group consisting of In, Zn, Sn, Al, Si, Ge, Ti, Ga, Ta, Nb, Hf, Zr, Cr, Bi and Mg;
- a nitride of at least one element selected from the group consisting of Si, Ge and Ti;
- a Zn sulfide; and
- a carbide of at least one element selected from the group consisting of Si, Ti and W.

12. The optical information recording medium according to claim 7, wherein a thickness of the dielectric layer is from 2 to 40 nm.

13. The optical information recording medium according to claim 6, wherein a thickness of the recording layer is from 5 to 100 nm.

14. The optical information recording medium according to claim 6, wherein the recording layer further comprises a bubble formed in a part of the recording layer which, when irradiated with laser light, undergoes a volume change, thereby recording.

15. A sputtering target, comprising:
an oxide of a metal X; and
Pd,
wherein:
a ratio of the Pd to a total of the metal X and the Pd is from 4 to 85 atomic %; and
the sputtering target is a suitable target in the formation of the recording layer of claim 1 or the recording layer in the optical information recording medium of claim 6.

16. A sputtering target comprising an alloy comprising:
from 4 to 85 atomic % of Pd; and
a metal X,
in terms of a ratio of the Pd to a total of the metal X and the Pd,
wherein the sputtering target is a suitable target in the formation of the recording layer of claim 1 or the recording layer in the optical information recording medium of claim 6.

17. The sputtering target according to claim 15, wherein the metal X is at least one selected from the group consisting of Sn, Zn, Bi, Ge, Co, W, Cu and Al.

18. The sputtering target according to claim 16, wherein the metal X is at least one selected from the group consisting of Sn, Zn, Bi, Ge, Co, W, Cu and Al.

19. The recording layer according to claim 1, which is suitable for an optical information recording medium on which recording occurs through radiation with a laser light.

* * * * *